United States Patent [19]
Hobrecht

[11] Patent Number: 5,021,682
[45] Date of Patent: Jun. 4, 1991

[54] INSTANTANEOUS POWER LIMITING CIRCUIT

[75] Inventor: Stephen W. Hobrecht, Los Altos, Calif.

[73] Assignee: National Semiconductor Corporation, Santa Clara, Calif.

[21] Appl. No.: 350,490

[22] Filed: May 11, 1989

[51] Int. Cl.$^5$ .......................... H03K 3/01; H03K 3/26
[52] U.S. Cl. .................. 307/296.8; 307/270; 323/312
[58] Field of Search ................. 307/296.8, 296.1, 270; 323/312

[56] References Cited
U.S. PATENT DOCUMENTS

| | | | |
|---|---|---|---|
| 4,553,044 | 11/1985 | Bittner | 307/270 |
| 4,559,458 | 12/1985 | Ma | 307/270 |
| 4,633,095 | 12/1986 | Komatu | |
| 4,647,793 | 3/1987 | Davis | 307/270 |

Primary Examiner—Stanley D. Miller
Assistant Examiner—Richard Roseen
Attorney, Agent, or Firm—Gail W. Woodward; Lee Patch; Michael A. Glenn

[57] ABSTRACT

A DMOST driver circuit responds to the current flowing in the DMOST and the voltage appearing across it. The current and voltage are multiplied together in a $g_m$ amplifier which is coupled to drive a first input of a diff-amp. The diff-amp has its second input coupled to a source of reference potential. The diff-amp output is coupled to the DMOST gate to create a stabilizing negative feedback loop. The first diff-amp input is also coupled to a reference potential related threshold voltage so that the drive to the DMOST will be controlled by the DMOST power dissipation multiplied by a predetermined constant which is chosen to provide a safe dissipation level.

7 Claims, 1 Drawing Sheet

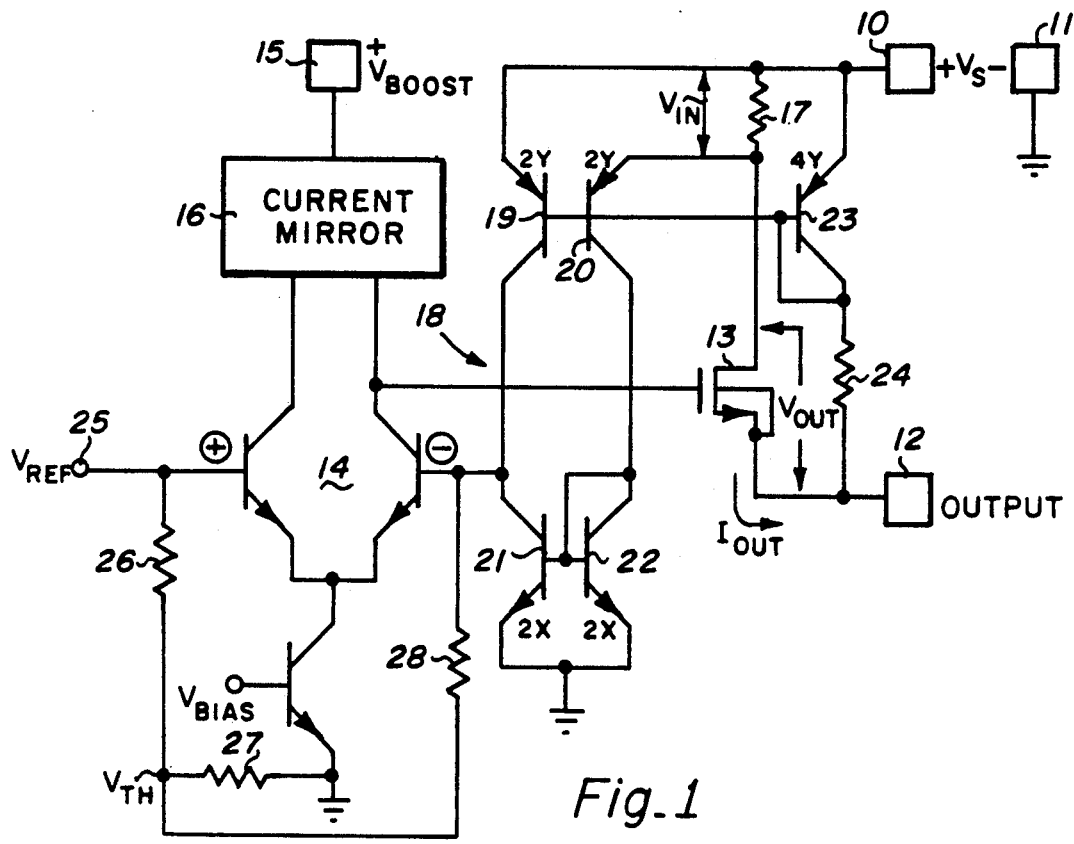
Fig_1
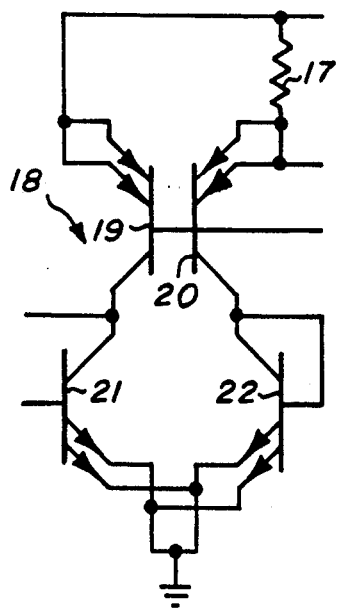
Fig_2

INSTANTANEOUS POWER LIMITING CIRCUIT

BACKGROUND OF THE INVENTION

The invention relates to so-called diffused metal oxide semiconductor transistor (DMOST) drivers. Such drivers are disclosed in U.S. Pat. No. 4,888,505, Ser. No. 189,442, which was filed by Timothy J. Skovmand on Mar. 2, 1988. It is titled VOLTAGE MULTIPLIER COMPATIBLE WITH A SELF-ISOLATED C/DMOS PROCESS. A DMOST can drive a load so that the load voltage closely approaches the supply. In order to do this the gate must be overdriven to a significant extent and this necessitates a source of potential that is higher than the operating supply. In this application the boosted potential is achieved by means of a voltage multiplying rectifier driven by the circuit clock. A number of other versions of such "boost" circuits are well known in the art. The above patent issued on Dec. 19, 1989, as U.S. Pat. No. 4,888,505, is assigned to the assignee of the present application and its teaching is incorporated herein by reference.

Such DMOST devices can be constructed to be junction isolated using a complementary semiconductor metal oxide semiconductor (CMOS) process that can also include more conventional bipolar elements normally found in the well-known monolithic silicon planar epitaxial PN junction isolated IC devices. A power DMOST can be created from a large number of small parallel-connected elements. The operating voltage can be kept reasonably high and the current conducting capability can be made substantial. For example, the on resistance of a power DMOST can be made as low as a fraction of an ohm.

Typically, the prior art DMOST IC devices were shut down when the chip temperature exceeds some predetermined threshold. It would be desirable to electronically limit the power dissipation without having to wait for the chip to heat.

SUMMARY OF THE INVENTION

It is an object of the invention to provide a power DMOST with circuitry that limits the instantaneous power dissipation to a safe level.

It is a further object of the invention to sense the power in a DMOST and to limit its conduction to a safe power level.

It is a still further object of the invention to sense the current through a DMOST and to sense the voltage across it so that when the two are multiplied together a sense of the power dissipation is achieved.

These and other objects are achieved in the following manner. A very low value series resistor is connected in series with the DMOST and the voltage it produces is applied to the input circuit of a transconductance ($g_m$) amplifier. A diode-series resistor combination is connected across the DMOST so that a voltage appears across the diode as a function of the current in the resistor and hence the DMOST voltage. The diode voltage drop is also applied to the $g_m$ amplifier input. Thus, the $g_m$ amplifier will produce a single ended output current that is related to the product of the DMOST voltage and current. The $g_m$ amplifier drives the inverting input of a diff-amp, the output of which is directly coupled to the DMOST gate. The other diff-amp input is connected to a source of reference potential. A voltage divider coupled across the voltage reference has a resistor coupled between its tap and the $g_m$ amplifier output.

In this circuit configuration the diff-amp will drive the gate of the DMOST until the diff-amp input differential is zero. For this condition the resistor values will operate with the $g_m$ amplifier output to provide a multi plier constant which holds the dissipation in the DMOST at a constant value. This multiplier constant is selected so that the DMOST dissipation is closely controlled to be below a critical level. The construction of the $g_m$ amplifier is carefully balanced so that its operation is controlled by only its inputs in combination with the thermal voltage. Since the thermal voltage varies the $g_m$ inversely with temperature and since the current sense resistor is made of metal to have a positive temperature coefficient, the $g_m$ amplifier is temperature compensated to a first order.

BRIEF DESCRIPTION OF THE DRAWINGS

FIG. 1 is a schematic diagram of the circuit of the invention.

FIG. 2 is a schematic diagram showing the details of the $g_m$ amplifier.

DESCRIPTION OF THE INVENTION

With reference to the schematic diagram of FIG. 1 an operating power supply, $V_S$, is connected + to terminal 10 and − to ground terminal 11. Terminal 12 comprises the circuit output and is intended to drive a load (not shown) that will be connected between terminal 12 and ground. A junction-isolated power DMOST 13 has its source connected to terminal 12. A DMOST is employed in this configuration because such devices can be manufactured in an IC substrate in a manner that is compatible with other devices. When a power DMOST is desired it is usually composed of a large number of small elements connected in parallel. In this way, almost any reasonable power level can be obtained and the combination will present a very low on resistance.

The DMOST gate is driven from diff-amp 14 which is operated from a supply boost terminal 15 by way of a current mirror load 16. This boosted supply concept is well known in DMOST driver and is related to the fact that in order to drive DMOST 13 to its maximum conduction, the gate will have to be pulled substantially above its drain. The potential at $V_{BOOST}$ terminal 15 is a controlled increment above the $+V_S$ at terminal 10. This is accomplished by circuitry well known in the art.

A current sensing resistor 17 is coupled in series with the DMOST drain and returns it to the $+V_S$ terminal 10. Thus, $I_{OUT}$ flows in resistor 17 to develop what is termed $V_{IN}$ which is the input voltage of $g_m$ amplifier 18. This amplifier is composed of transistors 19-22. The bases of input transistors 19 and 20 are coupled together and to diode connected transistor 23. The current flowing in transistor 23 is equal to the current flowing in resistor 24 which is directly proportional to the voltage across DMOST 13. This is labeled $V_{OUT}$.

Resistor 17 is made small with respect to the on resistance of DMOST 13. In a preferred embodiment resistor 17 had a value of about 2 milliohms. Since the on resistance of a power DMOST is typically on the order of 0.8 ohm, resistor 17 will have little influence on the ability of the circuit to source current. For example, with a 5 amp output, resistor 17 will drop only 10 millivolts.

Resistor 24 is made large, typically on the order of 50 k ohms. Its conduction at moderate $V_{OUT}$ values will be fractional milliamperes. This is insignificant in terms of the circuit current capability. The current flowing in resistor 24 forward biases transistor 23 and pulls the bases of transistors 19 and 20 down. Thus, $V_{OUT}$ acts to commonly bias the input of $g_m$ amplifier 18 and $I_{OUT}$ produces $V_{IN}$ which differentially biases the emitters of transistors 19 and 20.

It will be noted that transistor 23 has an area (for instance emitter area) of 4 y and transistors 19 and 20 are each of 2 y area. Thus, the input areas of transistors 19 and 20 of $g_m$ amplifier 18 match the area of transistor 23. As a result the transconductance of amplifier $$g_m = \frac{V_{OUT}}{2 \cdot R24 \cdot V_T} \quad (1)$$

where:
R24 is the value of resistor 24 in ohms and
$V_T$ is the thermal voltage (about 26 millivolts at 300° k.). The factor 2 is due to the fact that half of the current flowing in resistor 24 will flow in each of transistors 19 and 20. The combination of transistors 19 and 20 form a unity gain current mirror with transistor 23.

It can be seen that $g_m$ amplifier 18 employs transistors 21 and 22 as a current mirror load that produces a single ended output. Transistors 21 and 22 are carefully matched to provide an accurate differential to single ended signal conversion. FIG. 2 is a schematic diagram that details the connections of transistors 19-22. The input stage, comprising transistors 19 and 20 employs parallel connected pairs of emitters. The load transistors 21 and 22 employ cross-connected pairs of emitters. Thus, particular care has been taken with $g_m$ amplifier 18 to balance it and to control its transconductance.

From equation (1) it can be seen that $g_m$ is inversely proportional to $V_T$ and hence T. If resistor 17 is made from IC metallization (aluminum) its value will be proportional to temperature. Since $g_m$ and resistance are inversely proportional to temperature they will tend to cancel to a first order. Therefore, the output of $g_m$ amplifier 18 will be a substantially temperature independent current proportional to the product of $V_{OUT}$ and $I_{OUT}$.

The output of $g_m$ amplifier 18 is directly coupled to the inverting input of diff-amp 14. The noninverting input is connected to a temperature invariant source of reference voltage, $V_{REF}$ at terminal 25. This source is of well known construction. The output of diff-amp 14 is directly connected to the gate of DMOST 13. This completes a negative feedback loop which will force the gate of DMOST 13 to that level which will produce $V_{REF}$ at the inverting input of diff-amp 14.

Resistors 26 and 27 form a voltage divider from $V_{REF}$ to ground. Resistor 28 is connected between the divider tap and the output of $g_m$ amplifier 18. This means that any output current from $g_m$ amplifier 18 will flow into resistor 28. The equivalent resistance, $R_{EQ}$, looking into resistor 28 will be:

$$R_{EQ} = \frac{R26 \times R27}{R26 + R27} + R28 \quad (2)$$

where:
the values are in ohms for the designated resistors.
The voltage at the tap between resistors 26 and 27 is called the threshold voltage $V_{TH}$. This is:

$$V_{TH} = \frac{R27 \cdot V_{REF}}{R26 + R27} \quad (3)$$

When the drop across the equivalent resistance $R_{EQ}$ equals $V_{TH}$ the input to diff-amp 14 will be zero. Therefore:

$$V_{TH} = \frac{R_{EQ} \cdot R17 \cdot V_{OUT} \cdot I_{OUT}}{2V_T \cdot R24} \quad (4)$$

Since $R_{EQ}/2 \cdot R17/R24$ is a constant K for any particular circuit embodiment:

$$V_{TH} = \frac{K \cdot V_{OUT} \cdot I_{OUT}}{V_T} \quad (5)$$

From equation (5) it is clear that the power being dissipated in DMOST 13, is set by $V_{TH}$ and is expressed in terms of a constant K divided by the thermal voltage when multiplied by the power in watts.

The circuit of FIG. 1 operates to produce the results of equation 5. This means that the current flowing out of terminal 12 into a load will be limited by the load itself and the limits imposed by the circuit. That is the current supplied will not exceed that value where the power dissipation limit set is achieved.

EXAMPLE

The circuit of FIG. 1 was constructed using compatible CMOS/linear technology. The linear parts were fabricated using conventional silicon planar, monolithic, epitaxial, pn junction isolation construction. The following component values were employed:

| COMPONENT | VALUE |
| --- | --- |
| Resistor 17 | 2 milliohms |
| Resistor 24 | 51 k ohms |
| Resistor 26 | 3 k ohms |
| Resistor 27 | 12 k ohms |
| Resistor 28 | 24 k ohms |

The $V_{REF}$ generator produced 1.5 volts so that $V_{TH}$ was 0.3 volt. The DMOST power limit at 300° K. was 14 watts. Therefore, using a 12 volt supply would permit the circuit to supply 1.17 amperes.

The invention has been described, its operation detailed and an operating example given. When a person skilled in the art reads the foregoing description, alternatives and equivalents, within the spirit and intent of the invention, will be apparent. Accordingly, it is intended that the scope of the invention be limited only by the following claims.

I claim:
1. A circuit for limiting the power dissipation in a diffused metal oxide semiconductor transistor or DMOST, which passes a current therethrough and develops a voltage thereacross to a safe value, said circuit comprising:
    means for sensing the voltage across said DMOST;
    means for sensing the current passing through said DMOST;
    means for multiplying said voltage by said current to obtain a power dissipation related current; and
    means responsive to said dissipation related current to produce a control voltage that is coupled to said

DMOST to limit said power dissipation to a safe value.

2. The circuit of claim 1 wherein said means for sensing the current comprise a resistor having a value that is small compared with the DMOST on resistance coupled in series with said DMOST.

3. The circuit of claim 1 wherein said means for sensing voltage comprise a resistor coupled in parallel with said DMOST.

4. The circuit of claim 2 wherein said resistor is composed of metal.

5. The circuit of claim 1 wherein said means for multiplying comprise a transconductance amplifier.

6. The circuit of claim 4 wherein said transconductance amplifier has a differential input that is connected to said means for sensing current and a common input that is connected to said means for sensing voltage whereby said transconductance amplifier output is a current that is proportional to voltage multiplied by current.

7. The circuit of claim 4 wherein said means for multiplying is a transconductance amplifier that has an inverse temperature coefficient of transconductance that offsets the positive temperature coefficient of resistance in said metal resistor.

* * * * *